(12) United States Patent
Cheek et al.

(10) Patent No.: US 6,274,415 B1
(45) Date of Patent: Aug. 14, 2001

(54) SELF-ALIGNED $V_T$ IMPLANT

(75) Inventors: Jon D. Cheek, Round Rock; Mark Michael, Cedar Park; Derick J. Wristers; James F. Buller, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/489,068

(22) Filed: Jan. 21, 2000

(51) Int. Cl.[7] .................................................. H01L 21/337
(52) U.S. Cl. ............................................................ 438/194
(58) Field of Search ................................... 438/527, 149, 438/161, 217, 222–224, 227, 229, 232, 267, 269, 289, 290, 291, 301, 194

(56) References Cited

U.S. PATENT DOCUMENTS 5,698,884 * 12/1997 Dennen ................................. 257/345
6,074,920 * 6/2000 Houston .............................. 438/289

OTHER PUBLICATIONS

Stanley Wolf and Richard N. Tauber; *Silicon Processing for the VLSI Era, vol. 2 —Process Integration*; pp. 307, 312 and 381–383; 1990.

* cited by examiner

*Primary Examiner*—David Nelms
*Assistant Examiner*—Quoc Hoang
(74) *Attorney, Agent, or Firm*—Timothy M. Honeycutt

(57) ABSTRACT

Integrated circuits with transistors exhibiting improved junction capacitances and various methods of fabricating the same are provided. In one aspect, a method of manufacturing is provided that includes forming a doped region in an active area of a substrate wherein the doped region has a first conductivity type and a first horizontal junction. A first source/drain region of the first conductivity type is formed in the active area with a second horizontal junction. A second source/drain region of the first conductivity type is formed in the active area with a third horizontal junction and a lateral separation from the first source/drain region that defines a channel region. The second and third horizontal junctions are positioned substantially at the first horizontal junction. The portion of the doped region positioned in the channel region is doped with an impurity of a second conductivity type that is opposite to the first conductivity type. Impurity grading across a source/drain-to-body junction is less abrupt, resulting in improved junction capacitance.

19 Claims, 7 Drawing Sheets

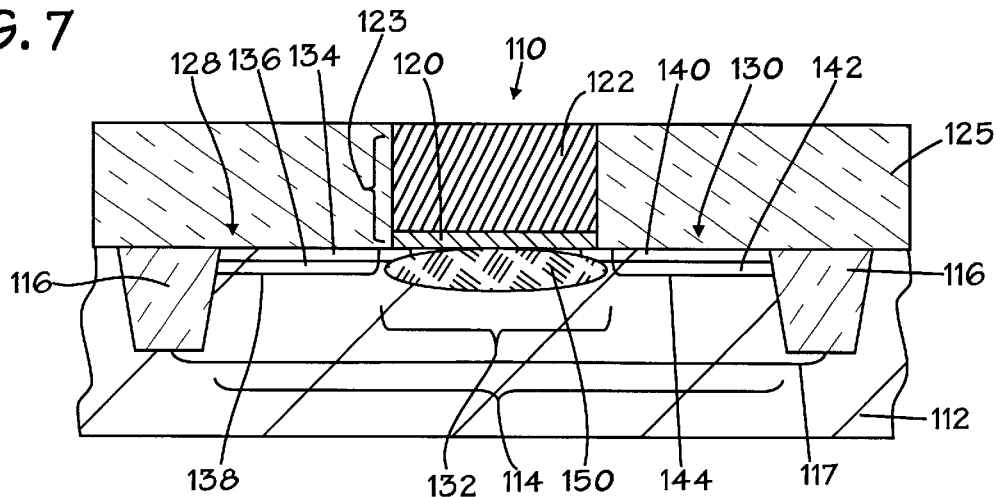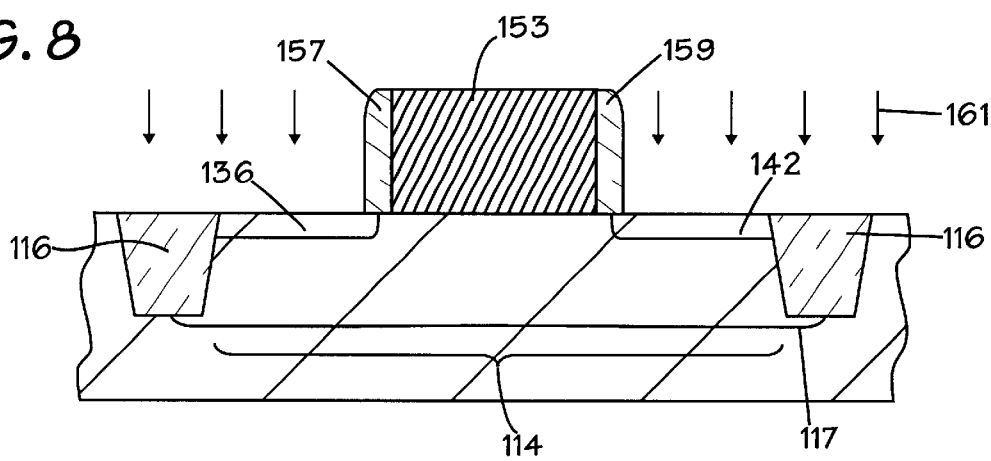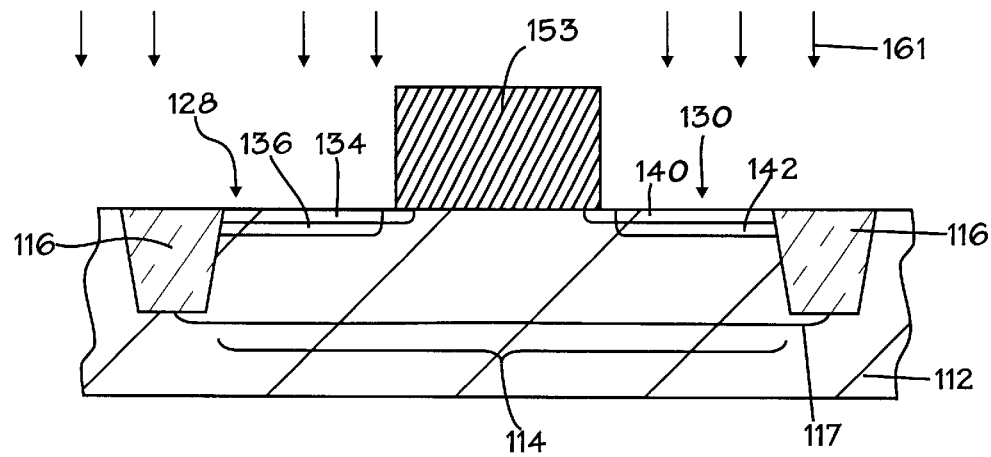

SELF-ALIGNED $V_T$ IMPLANT

BACKGROUND OF THE INVENTION

1. Field of the Invention

This invention relates generally to semiconductor fabrication, and more particularly to integrated circuits incorporating transistors with improved junction capacitances, and to methods of fabricating the same.

2. Description of the Related Art

One variant of a basic conventional metal oxide semiconductor ("MOS") transistor consists of a gate electrode stack fabricated on a lightly doped semiconductor substrate. The gate stack consists of a gate dielectric layer and a gate electrode. A source region and a drain region are formed in the substrate beneath the gate dielectric layer and separated laterally to define a channel region. The gate electrode is designed to emit an electric field into the channel region. Changes in the electric field emitted by the gate electrode enable, or alternatively, disable the flow of current between the source and the drain. In many processes, the source/drain regions consist of a lightly doped drain ("LDD") and an overlapping heavier doped region.

Switching speed is a primary indicator of MOS device performance. The switching speed of MOS transistors is affected by a variety of mechanisms, such as the channel transit time, i.e., the time required for a charge to be transported across the channel. However, the predominant mechanism affecting device speed is the time required to charge and discharge the various capacitances that exist between device electrodes and between interconnecting lines and the substrate. At the circuit level, the propagation delays are frequently limited by the interconnection-line capacitances. At the device level, however, the gate delay is determined primarily by the channel transconductance, the MOS gate capacitance and the parasitic or junction capacitances between the source/drain regions and the body, that is, the substrate or the well in circuits utilizing doped wells. Reductions in any or all of these capacitance values can result in increases in the device switching speed.

The gate capacitance of a MOS transistor may be decreased by decreasing the gate area, although this decrease is offset somewhat by a corresponding necessary reduction in the thickness of the gate dielectric layer. However, one of the major parasitic capacitances affecting the switching speed of a typical MOS transistor is junction capacitance. Tailoring junction capacitance involves a careful balancing of competing design considerations. As a general rule, lower doping levels in the substrate or body translate into lower junction capacitances. Indeed, obtaining maximum circuit performance from a MOS device involves maximizing the drive current and minimizing junction capacitances and body effect, all of which favor lower doping concentrations in the device body. However, competing design considerations, such as optimizing packing density, favors raising the same doping concentrations to avoid punchthrough and to achieve high field thresholds.

Many conventional MOS transistor fabrication techniques incorporate implants to adjust the threshold voltage, $V_T$ of the transistor and to prevent punchthrough. These implants, of necessity, modify the doping characteristics of the channel region. A disadvantage associated with the conventional fabrication technique is that such implants modify the doping characteristics across the entire width and breadth of a given well. Thus, in an n-channel device fabricated in a p-well, $V_T$ and punchthrough implants raise the effective doping level of the p-well and thus increase the resulting junction capacitance.

One conventional method for attempting to position $V_T$ adjust and punchthrough prevention impurities in the channel region involves the fabrication of a photomask with an opening that is positioned only over the anticipated channel region. The difficulty with this method is that the photomask has proven difficult to accurately and reliably fabricate. The problem can be traced to the tight lateral dimensions involved, i.e., sub-1.0 micron, and to the uncertainty involved in how closely the patterned opening in the photomask will conform to the dimensions and positions of the subsequently formed gate electrode and dielectric spacers.

Another disadvantage associated with the conventional MOS transistor fabrication is the potential for increased junction capacitance with the fabrication of abrupt pn junctions. The source/drain regions of a MOS device are normally heavily doped to minimize their resistivities. In processes utilizing ion implantation, this heavy doping concentration is normally achieved by performing a relatively high dosage, low energy implant. In an n-channel device, this type of implant produces a relatively steep tail-off in the n+ doping concentration at the pn junction. This rather steep dopant gradient results in a relatively high junction capacitance.

One conventional technique for attempting to reduce the doping gradient in the vicinity of the pn junction involves performing an additional source/drain implant to a much greater depth than the LDD and heavier doped region source/drain implants. The difficulty associated with this method is the fact that the high energy necessary to achieve a sufficient depth for the implant gives rise to a correspondingly high potential for impurity ions to bore through the gate electrode, particularly polysilicon gate electrodes, and either corrupt the doping of the gate itself, or the underlying gate oxide and/or channel regions. This outcome is a consequence of the fact that this third and deep implant is performed following gate definition.

The present invention is directed to overcoming or reducing the effects of one or more of the foregoing disadvantages.

SUMMARY OF THE INVENTION

In accordance with one aspect of the present invention, a method of manufacturing is provided that includes forming a doped region in an active area of a substrate wherein the doped region has a first conductivity type and a first horizontal junction. A first source/drain region of the first conductivity type is formed in the active area with a second horizontal junction. A second source/drain region of the first conductivity type is formed in the active area with a third horizontal junction and a lateral separation from the first source/drain region that defines a channel region. The second and third horizontal junctions are positioned substantially at the first horizontal junction. The portion of the doped region positioned in the channel region is doped with an impurity of a second conductivity type that is opposite to the first conductivity type.

In accordance with another aspect of the present invention, a method of manufacturing is provided that includes forming a temporary gate on a substrate. A first source/drain region and a second source/drain region are formed in the substrate. The first and second source/drain regions have a first conductivity type and the second source/drain is laterally separated from the first source/drain region to define a channel region. An insulating layer is formed on the substrate adjacent to the temporary gate. The temporary gate is removed to leave an opening in the insulating layer.

The channel region is doped by implanting an impurity species through the opening and into the channel region. The impurity species has a second conductivity type that is opposite to the first conductivity type.

In accordance with another aspect of the present invention, a method of manufacturing is provided that includes forming a doped region in an active area of a substrate. The doped region has a first conductivity type and a first horizontal junction. A temporary gate is formed on a substrate. A first source/drain region of the first conductivity type is formed in the active area with a second horizontal junction. A second source/drain region of the first conductivity type is formed in the active area with a third horizontal junction and a lateral separation from the first source/drain region that defines a channel region. The second and third horizontal junctions are positioned substantially at the first horizontal junction. An insulating layer is formed on the substrate adjacent to the temporary gate. The temporary gate is removed to leave an opening in the insulating layer. The channel region is doped by implanting an impurity species through the opening and into the channel region. The impurity species has a second conductivity type that is opposite to the first conductivity type.

In accordance with another aspect of the present invention, an integrated circuit is provided that includes a substrate and a plurality of transistors positioned on a plurality of active areas of the substrate. Each of the transistors has a gate insulating layer, a gate electrode positioned on the gate insulating layer, a doped region of a first conductivity type that has a first horizontal junction, a first source/drain region and a second source/drain region. The first source/drain region is of the first conductivity type and has a second horizontal junction. The second source/drain region is also of the first conductivity type, has a third horizontal junction and a lateral separation from the first source/drain region that defines a channel region. The second and third horizontal junctions are positioned substantially at the first horizontal junction, and the portion of the doped region positioned in the channel region is doped with an impurity of a second conductivity type that is opposite to the first conductivity type.

In accordance with another aspect of the present invention, an integrated circuit is provided that includes a substrate and a plurality of transistors positioned on a plurality of active areas of the substrate. Each of the transistors has a gate insulating layer, a gate electrode positioned on the gate insulating layer, a first source/drain region and a second source/drain region. The first source/drain region has a first conductivity type and a first horizontal junction. The second source/drain also has the first conductivity type, a second horizontal junction and a lateral separation from the first source/drain region that defines a channel region. A first doped region is positioned substantially only in the channel region and has a second conductivity type that is opposite to the first conductivity type.

BRIEF DESCRIPTION OF THE DRAWINGS

The foregoing and other advantages of the invention will become apparent upon reading the following detailed description and upon reference to the drawings in which:

FIG. 7 is a cross-sectional view of an alternate exemplary embodiment of an integrated circuit transistor fabricated in accordance with the present invention;

FIG. 8 is a cross-sectional view of an exemplary semiconductor substrate depicting fabrication of a temporary gate and portions of source/drain regions in accordance with the present invention;

FIG. 9 is a cross-sectional view like FIG. 8 depicting fabrication of LDD structures in accordance with the present invention;

DETAILED DESCRIPTION OF SPECIFIC EMBODIMENTS

Figure 1:
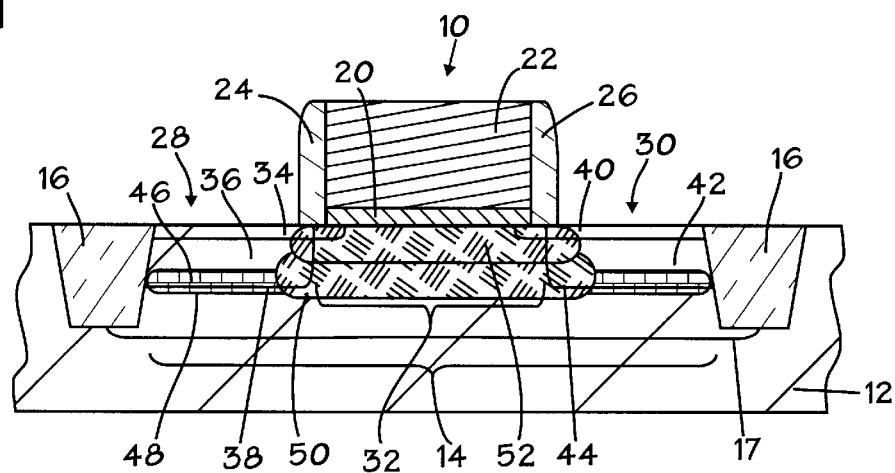
FIG. 1 is a cross-sectional view of an exemplary integrated circuit transistor fabricated in accordance with the present invention.

In the drawings described below, reference numerals are generally repeated where identical elements appear in more than one figure. Turning now to the drawings, and in particular to FIG. 1, there is shown a cross-sectional view of an exemplary embodiment of a transistor 10 formed on a semiconductor substrate 12. As used herein, the terms "formed on", "disposed on" or "positioned on" should be construed to include the possibility that a given layer or structure may be formed on another given layer or structure with a third or other intervening layers or structures disposed between the two. The substrate 12 may be composed of p-type silicon, n-type silicon, silicon-on-insulator or other suitable semiconductor substrate materials. The substrate 12 is much larger than the small portion depicted and there may be plural transistors 10 fabricated thereon to make up an integrated circuit. The transistor 12 is fabricated on an active area 14 of the substrate 12 that is circumscribed and defined by an isolation structure, two portions of which are visible in FIG. 1 and designated 16. The portions 16 are the visible portions of an overall moat-like structure that surrounds the active area 14. The transistor 10 will be described herein as an n-channel field effect transistor. Accordingly, junction isolation in the substrate 12 is provided by a p-well 17 formed in the active area 14. However, it should be understood that the transistor 10 may be implemented alternatively as a p-channel device within an n-well.

The transistor 12 includes a gate insulating layer 20 positioned on the substrate 12 and a gate electrode 22 that is formed on the gate insulating layer 20. The gate insulating layer 20 and gate electrode 22 are bracketed by a pair of dielectric sidewall spacers 24 and 26. The transistor 10 is provided with source/drain regions 28 and 30 that are laterally separated in the active area 14 to define a channel region 32. The phrase "source/drain region(s)" is used herein to describe a region that may serve as either a source or a drain. The skilled artisan will appreciate that a source/drain region may function as a source or a drain depending upon how it is interconnected with subsequent metallization. The source/drain region 28 consists of a lightly doped drain ("LDD") structure 34 and an overlapping heavier doped region 36. A horizontal junction of the heavier doped region 36 is designated 38. The source/drain region 30 similarly consists of an LDD structure 40 and an overlapping heavier doped region 42 which has a horizontal junction 44.

As noted above, it is desirable to reduce the capacitances between the source/drain regions 28 and 30 and the substrate 12, and more specifically the p-well 17. In order to reduce these junction capacitances, the active area 14 is provided with a doped region 46 that is formed by the introduction of an impurity specie of the same conductivity type as those used for the source/drain regions 28 and 30. The doped region 46 is positioned relative to the source/drain regions 28 and 30 so that its lower horizontal junction 48 is substantially at the same position but slightly below the horizontal junctions 38 and 44 of the source/drain regions 28 and 30. As described more fully below, the doped region 46 is provided by performing a relatively high energy, but low dosage implant whereas the overlapping heavier doped regions 36 and 42 are provided by performing a higher dosage but lower energy implant. In this way, the concentration of source/drain impurities above and below the horizontal junctions 38 and 44 tail off more gradually than in a conventional source/drain region fabricated using a high dosage low energy implant alone. Thus, the rate of change of n+ concentration as a function of depth both above and below the pn junction is reduced.

In order to prevent direct shorting across the channel 32 via the doped region 46, the portion of the doped region 46 crossing the channel 32 is counterdoped with an impurity of an opposite conductivity type. This counterdoping is achieved by establishing doped regions 50 and 52 via implants to adjust the threshold voltage $V_T$ of the transistor 10 and to prevent punchthrough.

Figure 2:
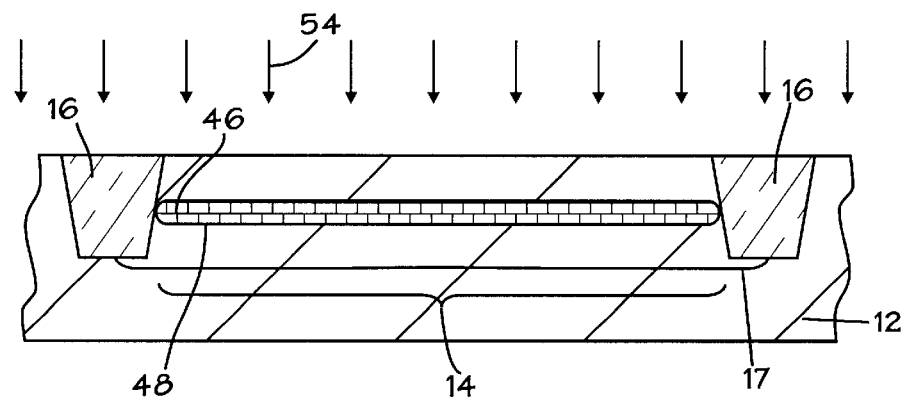
FIG. 2 is a cross-sectional view of an exemplary semiconductor substrate depicting the formation of a deep doped region in an active area in accordance with the present invention.

An exemplary process flow for fabricating the transistor 10 shown in FIG. 1 in accordance with the present invention may be understood by referring now to FIGS. 2, 3, 4, 5 and 6, and initially to FIG. 2. The process will be described in the context of an n-channel device. However, the skilled artisan will appreciate that the process may be applied to a p-channel device if desired by using impurities of a different conductivity type. Initially, the isolation structure 16 is fabricated in the substrate 12. The isolation structure 16 may be a shallow trench isolation structure, a field oxide region or other suitable electrical isolation structures. In an exemplary embodiment, the isolation structure 16 is a shallow trench isolation structure composed principally of tetra-ethyl-ortho-silicate ("TEOS"). The p-well 17 is established in the substrate 12 by implanting a p-type dopant, such as boron or $BF_2$ and performing a subsequent high temperature drive anneal at about 900 to 1100° C. for about 10 to 30 minutes in a furnace process.

Next, the doped region 46 is established by implanting n-type impurity ions 54. Arsenic, phosphorus, or another type of n-type impurity may be used. In an exemplary embodiment, phosphorus is implanted with a dosage of about 2E12 to 1E13 $cm^{-2}$ and an energy of about 55 to 85 keV. The implant will establish the doped region 46 with its lower horizontal junction 48 at some initial position in the p-well 17. It is anticipated that subsequent thermal steps will cause the position of the junction 48 to move downward slightly.

Figure 3:
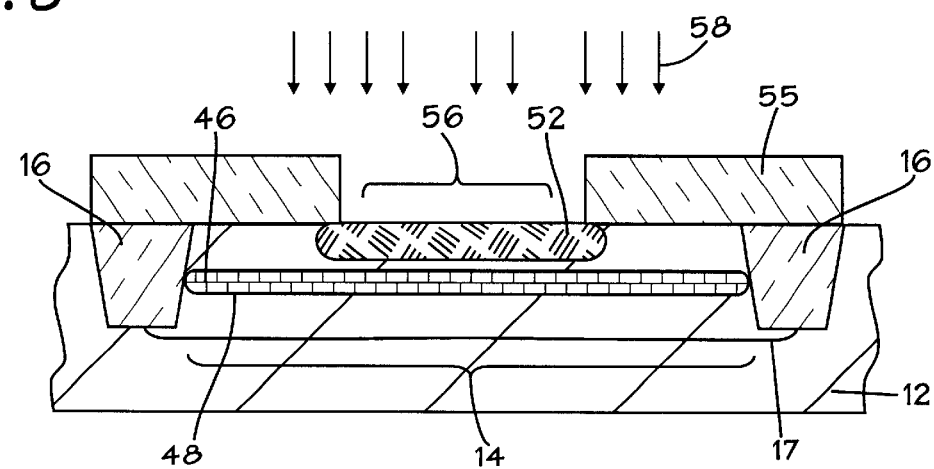
FIG. 3 is a cross-sectional view like FIG. 2 depicting the masking of a portion of the substrate in FIG. 2 and the formation of a first channel doped area in accordance with the present invention.
Figure 4:
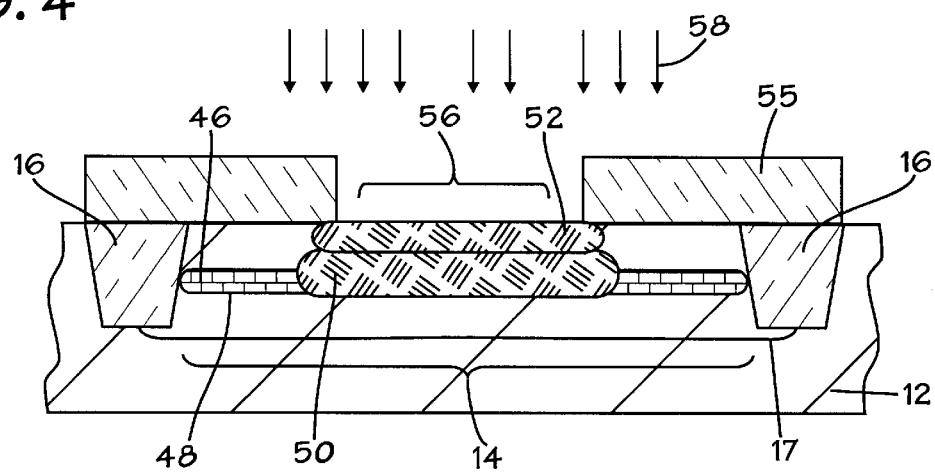
FIG. 4 is a cross-sectional view like FIG. 3 depicting formation of a second channel- doped region in accordance with the present invention.

The establishment of the doped regions 50 and 52 for $V_T$ adjustment and punchthrough prevention may be understood by referring now to FIGS. 3 and 4. Initially, the substrate is masked with a photomask 55 that is patterned to provide an opening 56 therein that has the approximate desired lateral dimension for the later-defined channel region 32 (see FIG. 1). Following the patterning of the mask 55, a $V_T$ adjust implant is performed using a p-type impurity 58, such as boron, at a dosage of about 1E12 to 1E13 $cm^{-2}$ and an energy of about 8 to 25 keV. It is anticipated that random interatomic collisions will result in some lateral encroachment of the doped region 52 beneath the edges of the opening 56.

Referring now to FIG. 4, a punchthrough prevention implant of p-type impurities 58 is performed to establish the doped region 50, which acts to counterdope the portion of the doped region 46 that spans the later defined channel region 32 (See FIG. 1). Boron may be implanted at about 1E12 to 1E13 $cm^{-2}$ and an energy of about 25 to 55 keV.

Following the formation of the doped regions 50 and 52, the mask 55 is stripped by ashing or other well known resist stripping techniques. A wafer clean is then performed using a standard HF dip. The concentration may be 10:1, 100:1, 200:1 or other suitable concentration.

Figure 5:
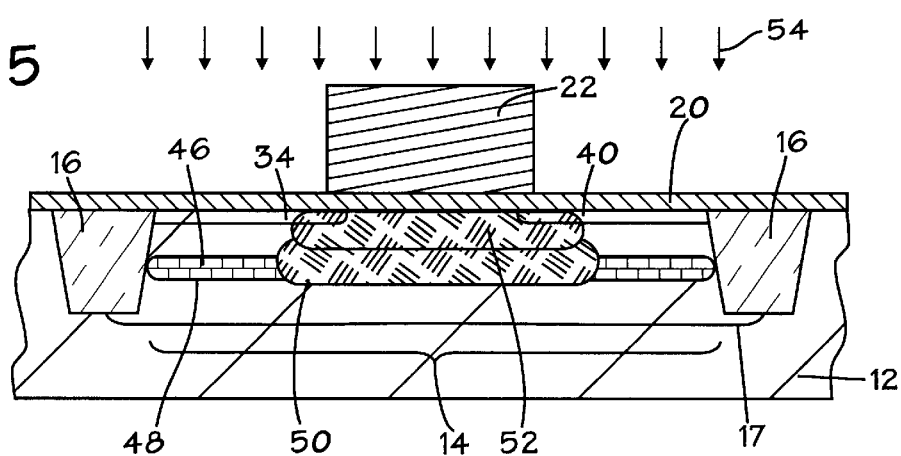
FIG. 5 is a cross-sectional view like FIG. 4 depicting fabrication of a gate electrode stack and LDD structures in accordance with the present invention.

The fabrication of the gate insulating layer 20, the gate electrode 22 and the LDD structures 34 and 40 may be understood by referring now to FIG. 5. Initially, the gate insulating layer 20 is established by thermal oxidation of the substrate 12 or by chemical vapor deposition ("CVD"). In an exemplary embodiment, the substrate 12 is subjected to a dry oxidation rapid thermal anneal ("RTA") process at about 800 to 1050° C. for about 10 to 60 seconds to yield a gate insulating layer 20 with a thickness of about 15 to 100 Å. The gate electrode 22 is thereafter patterned by blanket deposition a conducting material on the gate insulating layer 20 and subsequent patterning and anisotropic etching to yield the completed gate electrode 22. A variety of conducting materials may be used for the gate electrode 22, such as, for example, polysilicon, amorphous silicon, or other materials capable of undergoing subsequent annealing, or the like. In an exemplary embodiment, the gate electrode 22 is composed of polysilicon deposited to a thickness of about 1000 to 2000 Å using well known CVD techniques. The polysilicon is etched selectively to the gate insulating layer 20, which is left in place to act as a screen oxide against a later implant. The anisotropic etch may use a variety of etchant species suitable to etch polysilicon selectively to an underlying oxide, such as, for example, $CF_4/O_2$.

With the gate electrode 22 patterned, the LDD structures 34 and 40 are established by implanting n-type impurity ions 54. Arsenic, phosphorus, or another suitable type of n-type impurity may be used. In an exemplary embodiment, arsenic is implanted at a dosage of about 1E14 to 2E15 $cm^{-2}$ and an energy of about 2 to 5 keV. Activation of the LDD impurities and elimination of implant crystal damage is by an RTA at about 800 to 1000° C. for about 10 to 30 seconds.

Figure 6:
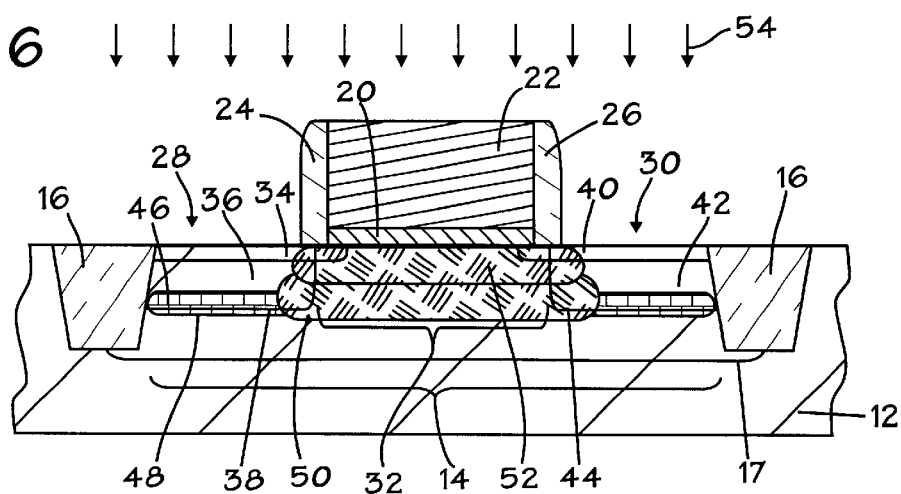
FIG. 6 is a cross-sectional view like FIG. 5 depicting fabrication of dielectric spacers and overlapping heavier doped regions in accordance with the present invention.

The fabrication of the overlapping heavier doped regions 36 and 42 for the source/drain regions 28 and 30 as well as the spacers 24 and 26 may be understood by referring now to FIG. 6. Initially, the portions of the gate insulating layer 20 functioning as a screen oxide in FIG. 5 are stripped using well known oxide stripping techniques. The spacers 24 and 26 are next established by blanket deposition of a dielectric material such as oxide or silicon nitride, followed by anisotropic etch selective to the underlying substrate 12. If desired, a second screen oxide layer (not shown) may be formed on the substrate 12 prior to the fabrication of the spacers 24 and 26 to protect the underlying LDD structures 34 and 40. Next, the overlapping heavier doped regions 36 and 42 are formed by implanting n-type impurity ions 54 and performing a subsequent anneal to activate the overlapped regions 36 and 42 and to repair any implant crystal damage. As with the LDD structures 34 and 40, the overlapped regions 36 and 42 may be established by implanting arsenic, phosphorus or another suitable type of n-type impurity. In an exemplary embodiment, arsenic is implanted at a dosage of about 2E15 to 5E15 $cm^{-2}$ and an energy of about 10 to 40 keV. An activation anneal is next performed at about 800 to 1000° C. for about 10 to 60 seconds.

The implant and the anneal are tailored so that the horizontal junctions 38 and 44 of the source/drain regions 28 and 30 are positioned substantially at the same position as the horizontal junction 48 of the doped region 46. The benefit of reduced source/drain region-to-substrate junction capacitance is achieved where the horizontal junctions 38 and 44 are positioned slightly above the horizontal junction 48.

An alternate exemplary embodiment of a transistor 10 may be understood by referring now to FIG. 7. The transistor 110 includes a gate insulating layer 120 formed on the substrate 112 and a gate electrode 122 formed on the gate insulating layer 120. The gate electrode 122 and the gate insulating layer 120 are formed in an opening 123 in an insulating layer 125 that is fabricated on the substrate 112. The transistor 110 is formed on an active area 14 that is defined by an isolation structure 116 and is co-located with a p-well 117. Source/drain regions 128 and 130 are provided in the active area 114 and are laterally separated therein to define a channel region 132. The source/drain region 128 includes an LDD structure 134 and an overlapping heavier doped region 136. The source/drain region 130 similarly includes an LDD structure 140 and an overlapping heavier doped region 142. The adjustment of the threshold voltage $V_T$ and the prevention of punchthrough is by way of the establishment of a doped region 150 that is confined substantially within the channel region 132. The doped region 150 has the same conductivity type as the well 117. However, since the doped region 150 is confined substantially to the channel region 132, the doping levels of the n-type source/drain regions 128 and 130 are not impacted, and thus the junction capacitances for the horizontal junctions 138 and 140 will be significantly reduced over structures fabricated using conventional methods wherein $V_T$ and punchthrough implants are applied across the entirety of an active area.

An exemplary process flow for fabricating the transistor 110 in accordance with the present invention may be understood by referring now to FIGS. 8, 9, 10, 11 and 12, and initially to FIG. 8. This alternate embodiment will be described in the context of the fabrication of an n-channel device. However, as noted above, the process may be applied to a p-channel device by changing the conductivity types of the impurities involved. Initially, the isolation structure 116 and the p-well 117 are established in the substrate 112 as described generally above. Thereafter, a temporary gate 153 is fabricated on the substrate 112 and bracketed by a pair of dielectric spacers 157 and 159. The temporary gate 153 functions as a hard mask against later source/drain implants and as a removable mold that enables the insulating layer 125 to be subsequently formed with a set lateral dimension for the opening 123 (See FIG. 7). The temporary gate 153 is patterned with a lateral dimension that corresponds to the approximate desired length for the channel region 132, taking into account any lateral diffusion of the source/drain regions 128 and 130 following the post implant anneal.

The temporary gate 153 should be composed of a material that is capable of withstanding source/drain activation anneals and resistant to impurity absorption during source/drain implants. In an exemplary embodiment, the gate 153 is fabricated by deposited polysilicon to a thickness of about 1000 to 2000 Å using well know CVD techniques.

The spacers 157 and 159 are thereafter fabricated from oxide, nitride or other dielectrics by oxidizing the gate 153 or by CVD, low pressure CVD, plasma enhanced CVD or the like. The spacers 157 and 159 may be about 200 to 600 Å thick.

The heavier doped regions 136 and 142 are established in the substrate 112 by implanting n-type impurity ions 161. Arsenic, phosphorus or another suitable type of n-type impurity may be used. In an exemplary embodiment, arsenic is implanted at a dosage of about 2E15 to 5E15 $cm^{-2}$ and an energy of about 10 to 40 keV.

The fabrication of the LDD structures 134 and 140 may be understood by referring now to FIG. 9. The spacers 157 and 159 depicted in FIG. 8 are stripped using well known oxide or nitride stripping techniques and the LDD structures 134 and 140 are then established by implanting n-type impurity ions 161. Arsenic, phosphorus, or another suitable type of n-type impurity may be used. In an exemplary embodiment, arsenic is implanted at a dosage of about 1E14 to 2E15 $cm^{-2}$ and an energy of about 2 to 5 keV. An anneal is then performed to activate the source/drain regions 128 and 130 and to repair any crystalline damage due to the implants. The anneal may consist of an RTA performed at about 800 to 1000° C. for about 10 to 60 seconds.

Figure 10:
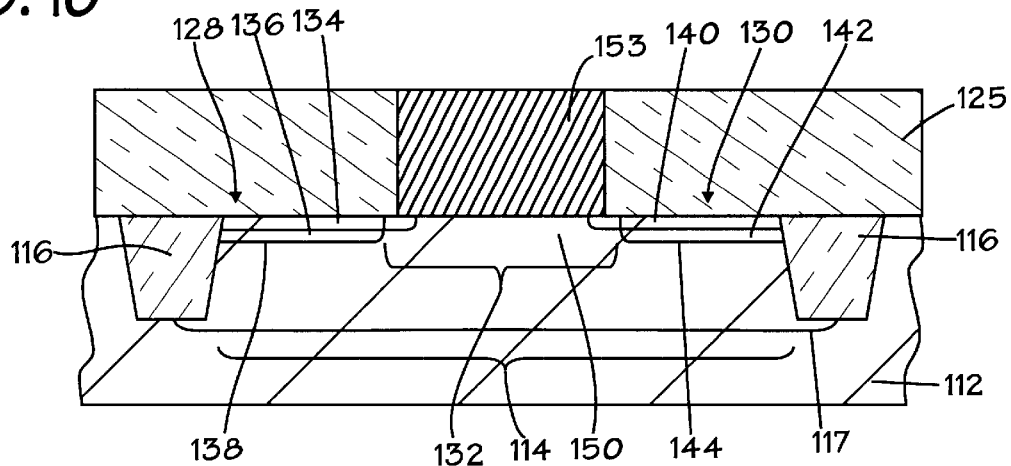
FIG. 10 is a cross-sectional view like FIG. 9 depicting fabrication of an interlevel dielectric layer in accordance with the present invention.

The fabrication of the insulating layer 125 may be understood by referring now to FIG. 10. The layer 125 is established by blanket depositing and planarizing TEOS to a final thickness of about 1500 to 2500 Å. Other dielectric materials, such as, for example, spin-on-glass, borophospho-silicate-glass, oxide or the like may be used in lieu of TEOS. The planarization may be by chemical mechanical polishing ("CMP"), etchback planarization or other well known planarization techniques.

Figure 11:
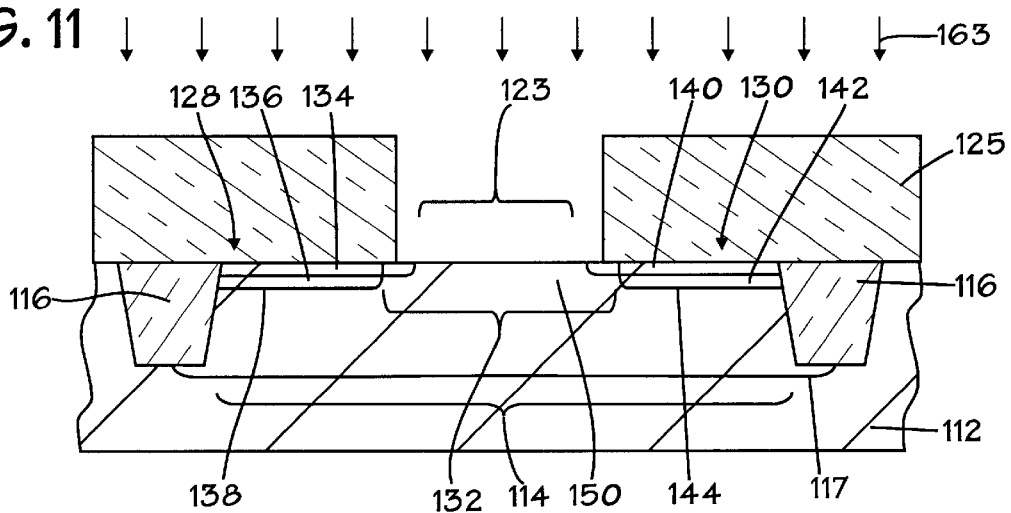
FIG. 11 is a cross-sectional view like FIG. 10 depicting removal of the temporary gate and implants to establish channel region $V_T$ adjust and punchthrough prevention doping in accordance with the present invention.

Referring now also to FIG. 11, the temporary gate 153 shown in FIG. 10 is stripped to leave the opening 123 in the insulating layer 125. The temporary gate 153 may be stripped by plasma etching the polysilicon selectively to the substrate 112 using $CF_4$.

The doped region 150 is next established in the active area 114 by implantation of p-type impurity ions 163. The insulating layer 125 acts as a hard mask against the implant and the window or opening 123 in the insulating layer enables a percentage of the implanting ions 163 to establish the doped region 150 substantially within the confines of the channel region 132. In this way, doping for the purposes of $V_T$ adjustment and punchthrough prevention is confined primarily to the channel region 132. Thus, the doping levels of the source/drain regions 128 are not impacted by the $V_T$ adjust and punchthrough implants and the ultimate junction capacitances from the source/drain regions 128 and 130 to the well 117 are dramatically reduced over that provided for in conventional processing.

Figure 12:
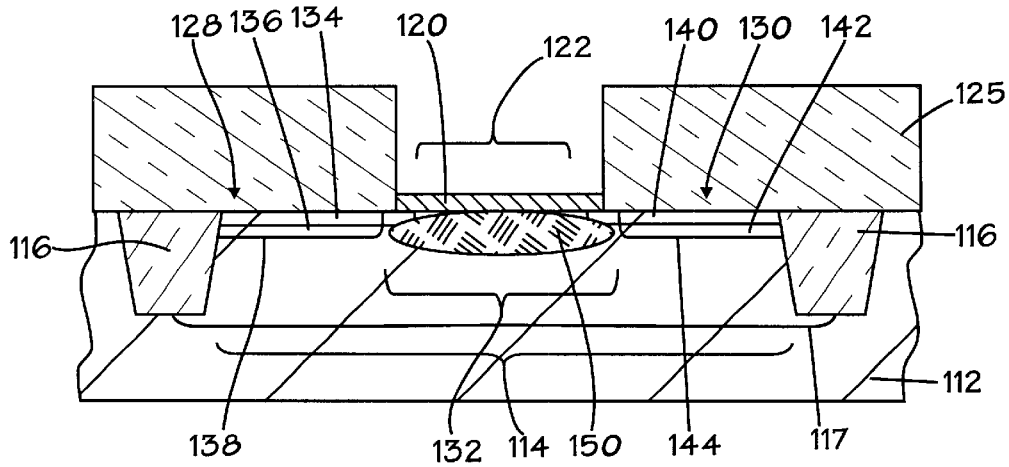
FIG. 12 is a cross-sectional view like FIG. 11 depicting fabrication of a gate insulating layer in accordance with the present invention.

The completion of the transistor 10 may be understood by referring now to FIG. 12 and again to FIG. 7. Referring initially to FIG. 12, the gate insulating layer 120 is formed on the substrate 112 and in the opening 123 by thermal oxidation, CVD or the like. In an exemplary embodiment, the gate insulating layer 120 is established with a thickness of about 25 to 35 Å by dry oxidation in a furnace process for about 10 to 30 minutes. Referring again to FIG. 7, the gate electrode 122 is fabricated by blanket deposition of a conducting material, such as, for example, tungsten, titanium or the like. A subsequent CMP step is performed to planarize the conducting material to the insulating layer 125 and establish the completed gate electrode 122. Although not shown, an adhesion layer of titanium nitride or other suitable adhesion layer materials may be formed between the insulating layer 125 and the gate electrode 122 in the event that a material with poor oxide adhesion characteristics, such as tungsten, is selected as the conductor material.

Figure 13:
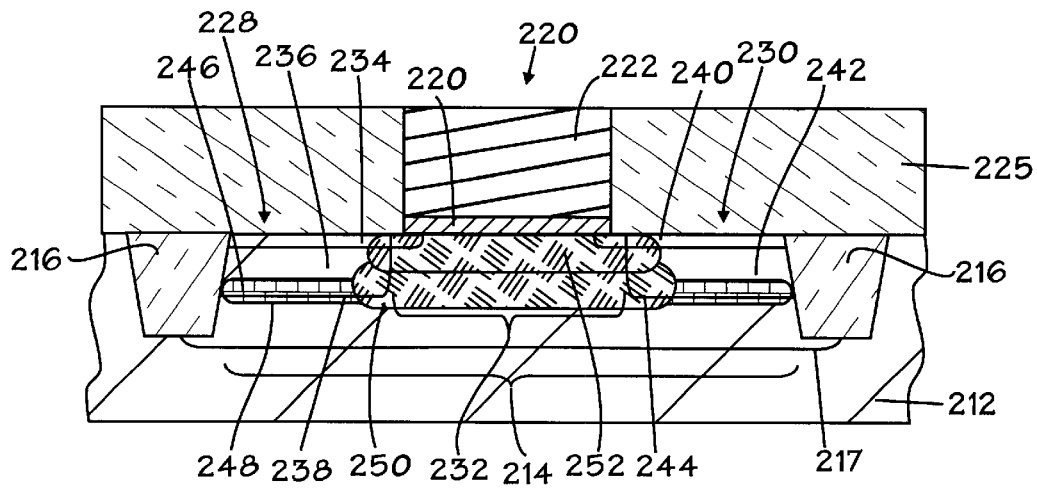
FIG. 13 is a cross-sectional view of an alternate exemplary embodiment of an integrated circuit transistor fabricated in accordance with the present invention.

FIG. 13 depicts another alternate embodiment of a transistor 210 formed on a semiconductor substrate 212 in accordance with the present invention. This illustrative embodiment incorporates beneficial features from the first two illustrated embodiments for the purpose of providing a transistor with reduced source/drain-to-well junction capacitance. The transistor 210 is fabricated on an active area 214 of the substrate 212 that is co-located with a p-well 217. The active area 214 is circumscribed and defined by the isolation structure 216. The transistor 210 includes a gate insulating layer 220 that is formed on the substrate 212 and a gate electrode 222 positioned on the gate insulating layer 220. The gate electrode 222 and the gate insulating layer 220 are bracketed by an interlevel dielectric or insulating layer 225. Source/drain regions 228 and 230 are formed in the active area 214 and separated laterally to define a channel region 232 in the active area 214. The source/drain region 228 consists of an LDD structure 234 and an overlapping heavier doped region 236. The horizontal junction of the heavier doped region 236 is designated 238. The source/drain region 230 similarly consists of an LDD structure 240 and an overlapping heavier doped region 242 which has a horizontal junction 244. A doped region 246 is provided in the active area 214 with its horizontal junction 248 positioned substantially at, but slightly below the horizontal junctions 238 and 244 of the respective source/drain regions 228 and 230. The doped region 246 consists of a concentration of impurities having the same conductivity type as the source/drain regions 228 and 230. The channel region 232 is counter-doped with p-type impurities to adjust the threshold voltage $V_T$ of the transistor 210 and to prevent punchthrough. Like the embodiment illustrated in FIGS. 7–12, the doped regions 250 and 252 are confined substantially to the channel region 232. Thus, the transistor 210 exhibits reduced junction capacitance through the confinement of the $V_T$ adjust and punchthrough prevention doping to the channel region 232. In addition, the incorporation of the doped region 246 provides for graded impurity concentration in the vicinity of the pn junctions 238 and 244 between the source/drain regions 228 and 230 and the well 217.

Figure 14:
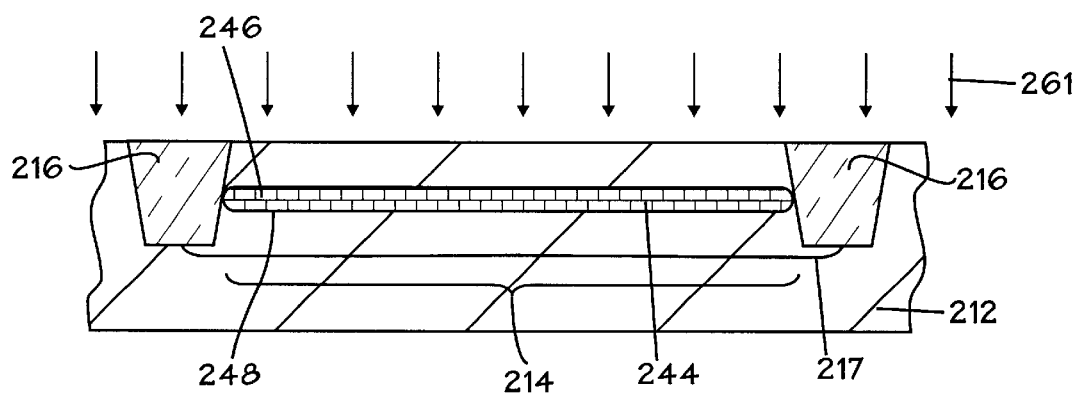
FIG. 14 is a cross-sectional view of an exemplary semiconductor substrate depicting formation of a deep doped region in an active area of the substrate in accordance with the present invention.
Figure 15:
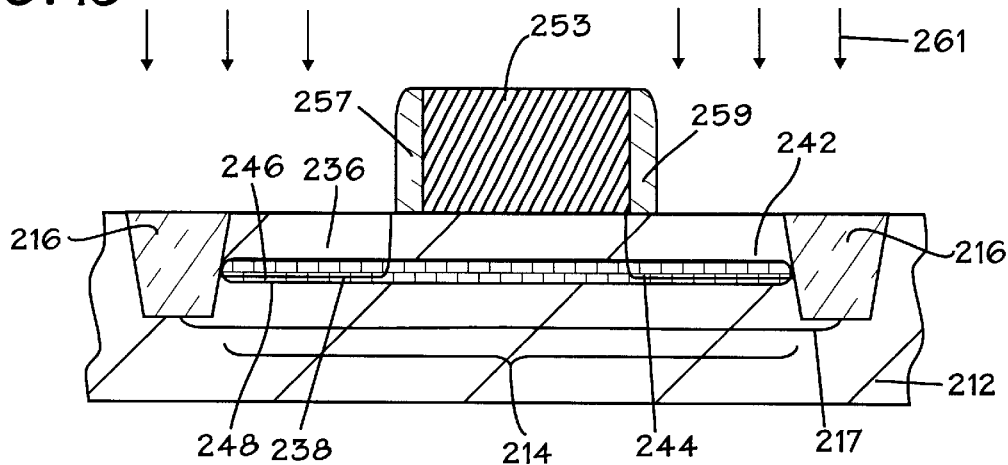
FIG. 15 is a cross-sectional view like FIG. 14 depicting fabrication of a temporary gate electrode and portions of source/drain regions in accordance with the present invention.

An exemplary process flow for fabricating the transistor 210 in accordance with the present invention may be understood by referring now to FIGS. 14, 15, 16, 17 and 18, and initially to FIG. 14. This alternate embodiment will be described in the context of the fabrication of an n-channel device. However, as noted above, the process may be applied to a p-channel device by changing the conductivity types of the impurities involved. Initially, the isolation structure 216, the p-well 217 are established in the substrate 212 as generally described above in conjunction with the fabrication of the isolation structure 116 and well 117 depicted in FIGS. 7–12. The doped region 246 is also formed in the substrate 212 by implanting impurity ions 261 using the techniques described above. Thereafter, and as shown in FIG. 15, a temporary gate 253 is fabricated on the substrate 212 and bracketed by a pair of dielectric spacers 257 and 259, again as described above in conjunction with the embodiment depicted in FIGS. 7–12. The heavier doped regions 236 and 242 are next established by implantation of impurity ions 261 using the parameters specified for the regions 136 and 142 depicted in FIG. 7 above. The respective junctions 238 and 244 of the regions 236 and 242 fall within but near the lower horizontal junction 248 of the doped region 246.

Figure 16:
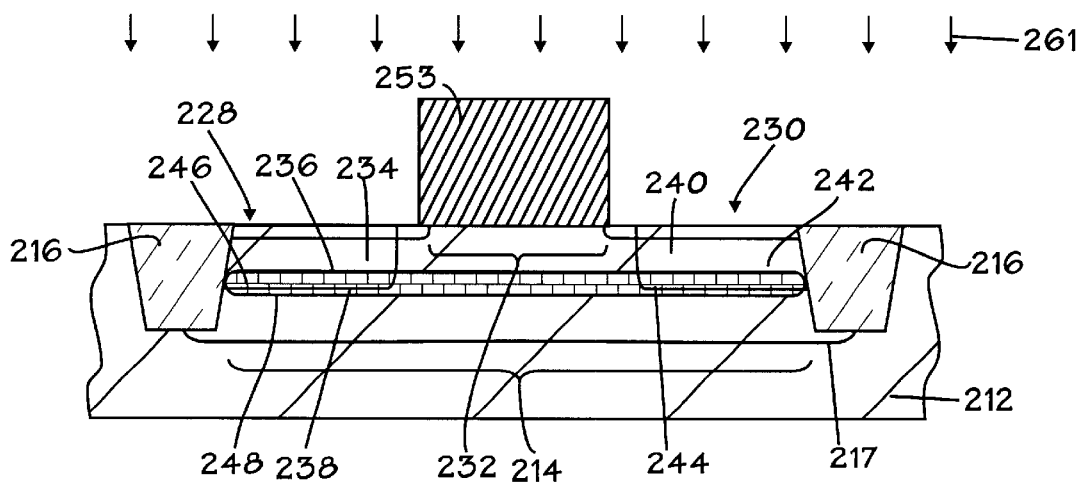
FIG. 16 is a cross-sectional view like FIG. 15 depicting fabrication of LDD structures in accordance with the present invention.

Referring now to FIG. 16, spacers 257 and 259 are stripped and the LDD regions 234 and 240 are formed by implanting impurity ions 261 and annealing as previously described above in conjunction with the source/drain regions 128 and 130 in FIG. 7.

Figure 17:
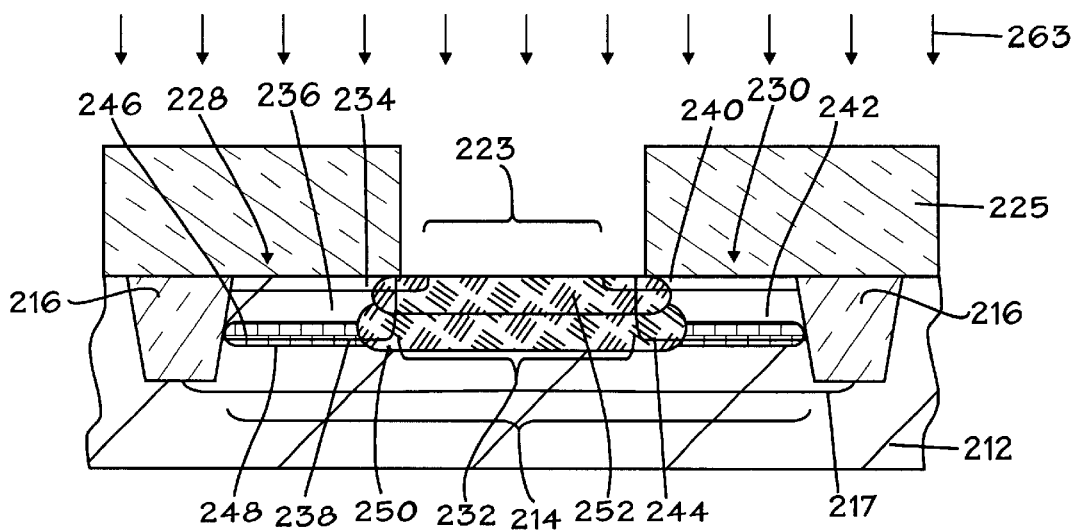
FIG. 17 is a cross-sectional view like FIG. 16 depicting fabrication of an interlevel dielectric layer, removal of the temporary gate and implants to establish channel-doped regions in accordance with the present invention.
Figure 18:
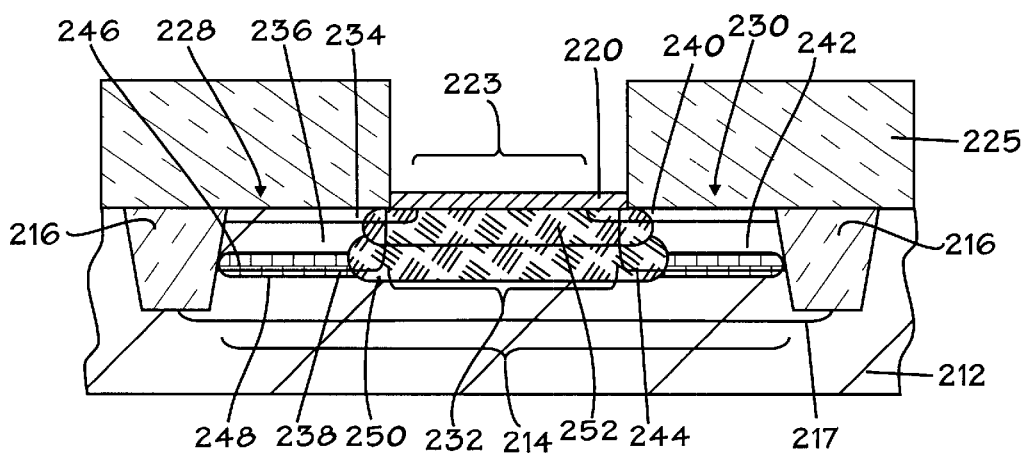
FIG. 18 is a cross-sectional view like FIG. 17 depicting fabrication of a gate insulating layer for the transistor in accordance with the present invention.

As shown in FIG. 17, the insulating layer 225 is formed with an opening 262 in the manner described above for the formation of the layer 125 and opening 123. The doped regions 252 and 250 are next established by implantation of p-type impurity ions 263 through the opening 262 using the parameters set forth above for the regions 152 and 150 shown in FIG. 7.

Referring now to FIG. 18 and again to FIG. 13, the gate insulating layer 220 is formed on the substrate 212 in the opening 262 and the gate electrode 222 is formed on the gate insulating layer 220 as described above in conjunction with the gate insulating layer 120 and gate electrode 122 shown in FIG. 7.

The foregoing illustrative embodiments provide a field effect transistor with improved, that is, reduced junction capacitance and potentially higher switching speeds. The improved junction capacitance is made possible by the impurity grading in the vicinity of the source/drain-to-well pn junction, by the confinement of $V_T$ and punchthrough doping to the channel region, or by both techniques together.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:

forming a doped region in an active area of a substrate, the doped region having a first conductivity type and a first horizontal junction;

forming a first source/drain region of the first conductivity type in the active area with a second horizontal junction;

forming a second source/drain region of the first conductivity type in the active area with a third horizontal junction and a lateral separation from the first source/drain region that defines a channel region, the second and third horizontal junctions being positioned substantially at the first horizontal junction; and doping the portion of the doped region positioned in the channel region with an impurity of a second conductivity type that is opposite to the first conductivity type.

2. The method of claim 1, wherein the doping of the portion of the doped region comprises implanting the channel with impurities of the second conductivity type.

3. The method of claim 2, wherein the implanting is performed through an opening patterned in a mask positioned on the substrate.

4. The method of claim 2, wherein the implanting comprises performing a threshold voltage control implant and a punchthrough prevention implant.

5. The method of claim 1, wherein the doped region is formed by implanting an impurity into the active area.

6. The method of claim 1, wherein the first and second source/drain regions are formed by implanting an impurity and annealing the substrate.

7. The method of claim 5, wherein each of the first and second source/drain regions is formed with a lightly doped drain.

8. A method of manufacturing a transistor, comprising:

forming a doped region in an active area of a substrate, the doped region having a first conductivity type and a first horizontal junction;

forming a first source/drain region of the first conductivity type in the active area with a second horizontal junction;

forming a second source/drain region of the first conductivity type in the active area with a third horizontal junction and a lateral separation from the first source/drain region that defines a channel region, the second and third horizontal junctions being positioned substantially at the first horizontal junction;

doping the portion of the doped region positioned in the channel region with an impurity of a second conductivity type that is opposite to the first conductivity type; and forming a gate insulating layer on the substrate and a gate electrode on the gate insulating layer.

9. The method of claim 8, wherein the doping of the portion of the doped region comprises implanting the channel with impurities of the second conductivity type.

10. The method of claim 9, wherein the implanting is performed through an opening patterned in a mask positioned on the substrate.

11. The method of claim 9, wherein the implanting comprises performing a threshold voltage control implant and a punchthrough prevention implant.

12. The method of claim 8, wherein the doped region is formed by implanting an impurity into the active area.

13. The method of claim 8, wherein the first and second source/drain regions are formed by implanting an impurity and annealing the substrate.

14. The method of claim 13, wherein each of the first and second source/drain regions is formed with a lightly doped drain and first and second insulating spacers are formed adjacent to the gate electrode.

15. A method of manufacturing, comprising:

forming a doped region in an active area of a substrate, the doped region having a first conductivity type and a first horizontal junction;

forming a temporary gate on a substrate;

forming a first source/drain region of the first conductivity type in the active area with a second horizontal junction;

forming a second source/drain region of the first conductivity type in the active area with a third horizontal junction and a lateral separation from the first source/drain region that defines a channel region, the second and third horizontal junctions being positioned substantially at the first horizontal junction;

forming an insulating layer on the substrate adjacent to the temporary gate;

removing the temporary gate to leave an opening in the insulating layer; and doping the channel region by implanting an impurity species through the opening and into the channel region, the impurity species having a second conductivity type that is opposite to the first conductivity type.

16. The method of claim 15, comprising forming a gate insulating layer on the portion of the substrate exposed by the opening and a gate electrode on the gate insulating layer.

17. The method of claim 15, comprising forming a gate insulating layer on the portion of the substrate exposed by the opening and a gate electrode on the gate insulating layer.

18. The method of claim 15, comprising forming first and second sidewall spacers adjacent to the temporary gate.

19. The method of claim 18, wherein each of the first and second source/drain regions is formed with a lightly doped drain.

* * * * *